United States Patent
Wang et al.

(10) Patent No.: US 7,780,254 B2
(45) Date of Patent: Aug. 24, 2010

(54) SLIDE RAIL STRUCTURE

(75) Inventors: Shi-Feng Wang, Shanghai (CN); Tsai-Kuei Cheng, Taipei (TW); Ji-Peng Xu, Shanghai (CN)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 12/345,464

(22) Filed: Dec. 29, 2008

(65) Prior Publication Data

US 2010/0089853 A1    Apr. 15, 2010

(30) Foreign Application Priority Data

Oct. 9, 2008  (CN) .................. 2008 1 0166511

(51) Int. Cl.
*A47B 88/00* (2006.01)

(52) U.S. Cl. ............... 312/334.7; 248/27.1; 248/298.1; 248/316.8; 248/250; 312/333; 312/334.8; 312/334.46; 312/334.44; 312/330.1; 384/21; 108/143

(58) Field of Classification Search ............... 248/27.1, 248/298.1, 316.8, 250; 312/333, 334.7, 334.8, 312/334.46, 334.44, 330.1; 384/21; 108/143
See application file for complete search history.

(56) References Cited

U.S. PATENT DOCUMENTS

| | | | | |
|---|---|---|---|---|
| 3,133,768 A * | 5/1964 | Klakovich | ................ | 384/17 |
| 4,988,214 A * | 1/1991 | Clement | ................ | 384/18 |
| 5,466,060 A * | 11/1995 | Hoffman | ................ | 312/334.8 |
| 5,577,821 A * | 11/1996 | Chu | ................ | 312/334.11 |
| 5,695,265 A * | 12/1997 | Hoffman | ................ | 312/334.5 |
| 5,851,059 A * | 12/1998 | Cirocco | ................ | 312/334.11 |
| 5,980,007 A * | 11/1999 | Singh | ................ | 312/334.1 |
| 6,224,178 B1 * | 5/2001 | Cirocco | ................ | 312/334.46 |
| 6,457,790 B1 * | 10/2002 | Liang et al. | ................ | 312/334.46 |
| 6,834,923 B2 * | 12/2004 | Young et al. | ................ | 312/334.8 |
| 6,854,816 B2 * | 2/2005 | Milligan | ................ | 312/334.11 |
| 6,926,377 B2 * | 8/2005 | Lammens et al. | ................ | 312/333 |
| 6,962,397 B2 * | 11/2005 | Dobler et al. | ................ | 312/333 |
| 6,979,067 B2 * | 12/2005 | Yang | ................ | 312/334.46 |
| 7,090,319 B2 * | 8/2006 | Milligan et al. | ................ | 312/334.46 |
| 7,111,913 B2 * | 9/2006 | Dubon | ................ | 312/333 |
| 7,178,888 B2 * | 2/2007 | Judge et al. | ................ | 312/334.46 |
| 7,571,968 B2 * | 8/2009 | Ji et al. | ................ | 312/333 |
| 7,604,307 B2 * | 10/2009 | Greenwald et al. | ................ | 312/333 |
| 2001/0054863 A1 * | 12/2001 | Uchino et al. | ................ | 312/334.12 |
| 2004/0012313 A1 * | 1/2004 | MacMillan | ................ | 312/334.44 |
| 2006/0163983 A1 * | 7/2006 | Wu | ................ | 312/333 |
| 2008/0211366 A1 * | 9/2008 | Brock et al. | ................ | 312/333 |
| 2008/0217497 A1 * | 9/2008 | Yang et al. | ................ | 248/298.1 |
| 2008/0303398 A1 * | 12/2008 | Hsiung et al. | ................ | 312/334.46 |

* cited by examiner

*Primary Examiner*—J. Allen Shriver, II
*Assistant Examiner*—Nkeisha J Smith
(74) *Attorney, Agent, or Firm*—J.C. Patents

(57) ABSTRACT

A slide rail structure disposed between a chassis and a rack is provided. The slide rail structure includes a first slide rail, a slider, a first connecting part and a second connecting part. The first slide rail is fixed on the rack. The slider is slidably connected to the first slide rail. The first connecting part is suitable for fixing on the chassis. The second connecting part is disposed on the slider and slidably connected to the first connecting part. The chassis slides on the first slide rail through the slider, the first connecting part and the second connecting part.

11 Claims, 4 Drawing Sheets

SLIDE RAIL STRUCTURE

CROSS-REFERENCE TO RELATED APPLICATION

This application claims the priority benefit of China application Ser. No. 200810166511.5, filed on Oct. 9, 2008. The entirety of the above-mentioned patent application is hereby incorporated by reference herein and made a part of this specification.

BACKGROUND OF THE INVENTION

1. Field of the Invention

The present invention relates to a slide rail structure. More particularly, the present invention relates to a slide rail structure installed between a chassis and a rack.

2. Description of Related Art

Generally, according to the application degree, computer host levels may be divided into personal computer hosts, server hosts, and super computers. For the personal computer host, usually one or two processors are used to process common enterprise administrative business or multimedia relevant information. If it intends to process other works with complicated operations or store a large amount of data, the server host is used in the industry. In response to the recent network demand, it is possible to select a server computer system having two to four processors, or even up to eight or sixteen processors. For the application of the ultra high operation performance, usually a super computer having tens or even hundreds, thousands of serially connected processors is adopted.

Recently, the commonly used server host in the industry is mainly a stackable and serially connected rack mount computer host. In the design, the size of a main board in the computer host is greatly reduced, a CPU, a chipset, a memory, and a hard disk are respectively disposed, and then the computer host is guided by a slide rail, so as to be assembled in the rack, such that the space is reduced and it is conveniently for replacement. Each server is substantially an independently operating and replaceable computer host. Recently, the server host has developed to a easily manageable rack server which has a thin appearance, small occupied space, and low power consumption.

The conventional slide rail structure used in racks are disposed as a pair on the two sides of the computer host. The slide rail structure is capable of supporting the weight of the computer host, so as to guide the computer host to move horizontally to be pulled out of the rack or pushed inside the rack. In more detail, the conventional slide rail structure includes an outside slide rail and an inside slide rail. The computer host may slide relative to the rack through the cooperation of the inside slide rail and the outside slide rail.

However, the inside slide rail must be disposed to the side of the computer host and cooperate with the outside slide rail on the rack to make the computer host slide relative to the rack. In other word, the width between the computer host and the rack must be capable of accommodating both the inside and the outside slide rails for the following installation of the slide rails and the computer host. Thus, when a wider computer host is disposed into the chassis, it may not be disposed if the width occupied by the inside and the outside rails is too large. Moreover, the guiding of the inside and the outside rails allows the computer to slide smoothly on the rack. However, if no stopper is present, it may cause danger as the computer host may slide out directly and drop when pulling the computer host out of the rack.

Also, when performing computer host maintenance or replacing internal components, the computer host needs to be pulled out from the rack to proceed the following actions which makes the process complicated and inconvenient as a space is required to dispose the computer host.

SUMMARY OF THE INVENTION

The present invention provides a slide rail structure that increases the convenience of assembling or disassembling a chassis to or from a rack.

The present invention provides a slide rail structure, which allows maintenance and internal component replacement of a computer host directly on the rack.

The present invention provides a slide rail structure suitable for disposing between a chassis and a rack. The slide rail structure includes a first slide rail, a slider, a first connecting part, and a second connecting part. The first slide rail is fixed to the rack. The slider is slidably connected to the first slide rail. The first connecting part is fixed to the chassis. The second connecting part is fixed to the slider and slidably connected to the first connecting part. The chassis slides on the first slide rail through the slider, the first connecting part and the second connecting part.

In one embodiment of the present invention, the first slide rail includes a slide rail body and two stoppers. The two stoppers are assembled respectively to the two ends of the slide rail body to limit a sliding path of the slider on the slide rail body.

In one embodiment of the present invention, the first slide rail further includes a leaf spring disposed on the slide rail body to temporarily limit the slider on one end of the slide rail body.

In one embodiment of the present invention, the slider includes a sliding part and a clamping part. The sliding part is assembled to the first slide rail and disposed within the first slide rail. The clamping part is connected to the sliding part. Here, the clamping part is disposed outside of the first slide rail and the clamping part includes an assembly groove to accommodate the second connecting part.

In one embodiment of the present invention, the first connecting part is a second slide rail, and the second connecting part is suitable for sliding into the second slide rail.

In one embodiment of the present invention, the second connecting part has an elastic latch, and the second slide rail has a latch hole corresponding to the elastic latch.

In one embodiment of the present invention, the distance from the center of the latch hole to the end of the chassis is a first distance. Moreover, the distance from the center of the elastic latch to the slider is a second distance, and the second distance is greater than the first distance.

In one embodiment of the present invention, when the chassis is pushed into the rack, the elastic latch first slides into the latch hole, and then departs from the latch hole. When the chassis is pulled out of the rack, the elastic latch slides into the latch hole again to maintain relative positions of the first connecting part and the second connecting part.

In one embodiment of the present invention, the elastic latch includes a fixing part, an elastic arm, a pressing part, and a guiding part. The fixing part is disposed on the second connecting part. The elastic arm is connected between the fixing part and the pressing part, and the pressing part is connected between the elastic arm and the guiding part.

In one embodiment of the present invention, the second connecting part is a strip-shaped plate metal.

In one embodiment of the present invention, the chassis includes a releasing hole, and the elastic latch is exposed by the releasing hole.

In one embodiment of the present invention, the first connecting part is fixed to an inner wall of the chassis and the first slide rail is disposed outside of the chassis.

The present invention utilizes the slide rail structure to enable the chassis to slide smoothly on the rack, thereby allows the chassis to assemble with the rack conveniently.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
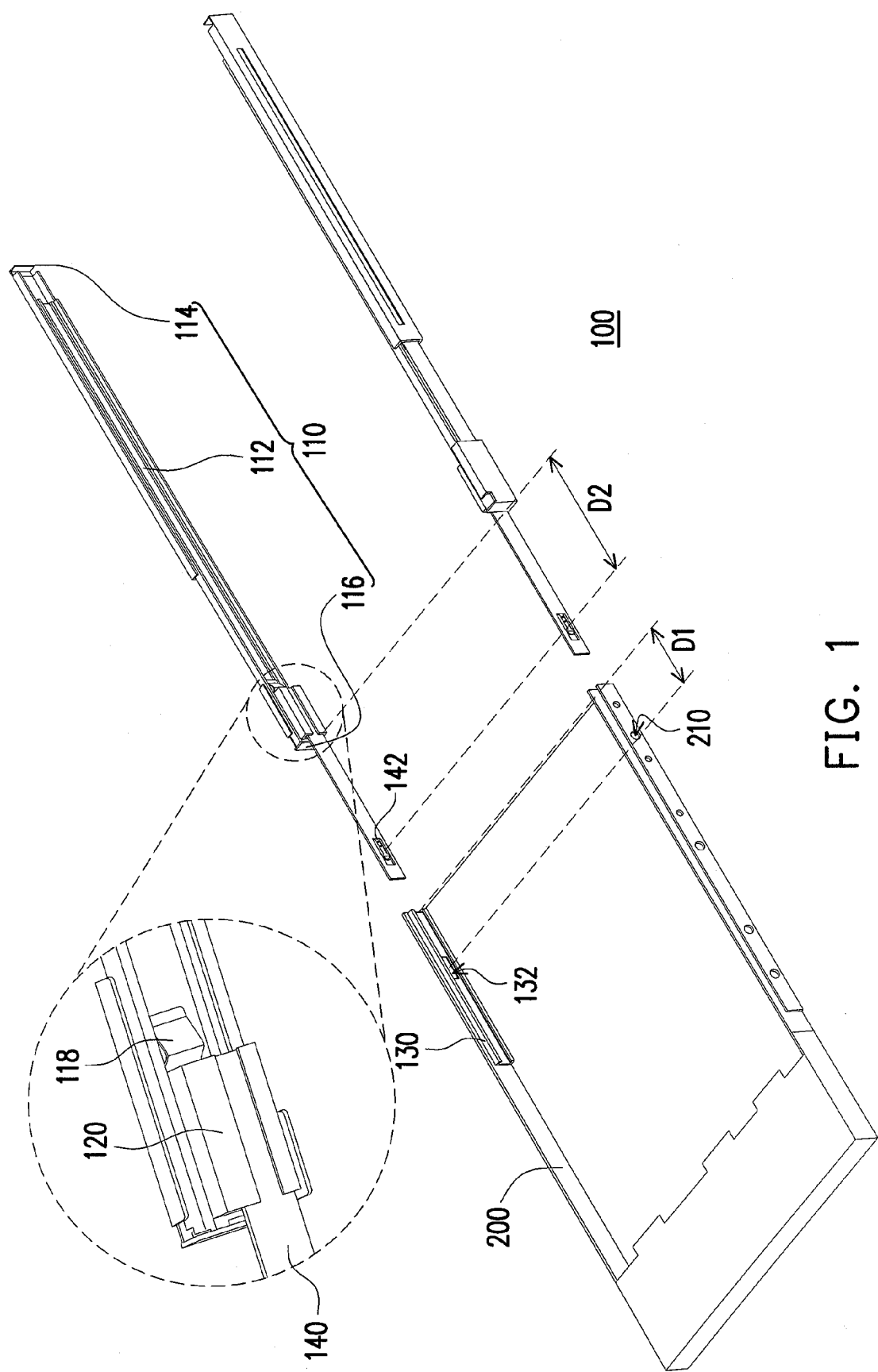
FIG. 1 is a schematic view of a slide rail structure according to one embodiment of the present invention.
Figure 2:
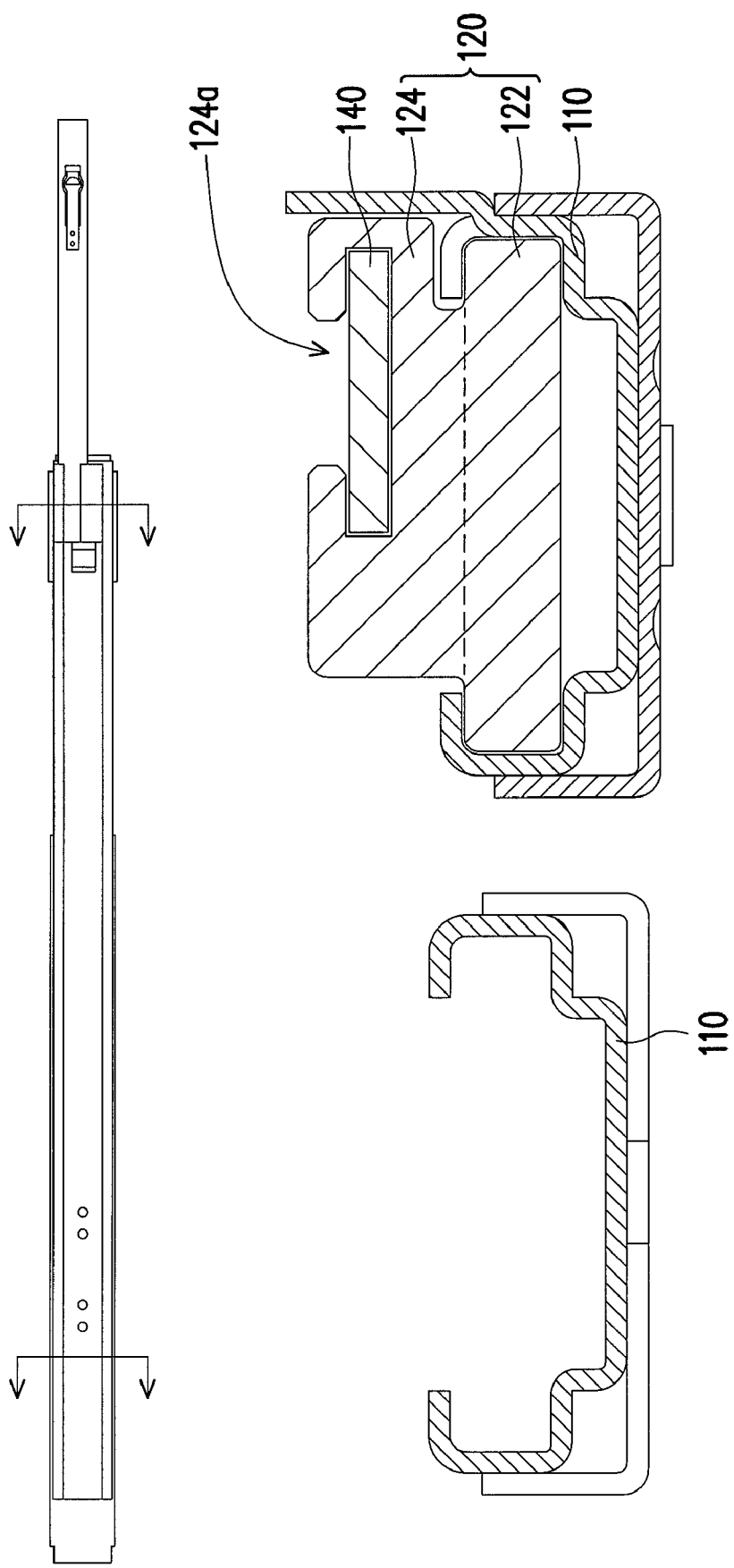
FIG. 2 is a schematic cross-sectional view of FIG. 1.

FIG. 1 is a schematic view of a slide rail structure according to one embodiment of the present invention. FIG. 2 is a schematic cross-sectional view of FIG. 1. Referring to FIG. 1 and FIG. 2, the slide rail structure 100 is disposed between a chassis 200 and a rack (not shown here) and is used to guide the movement of the chassis 200 when the chassis 200 is pushed into the rack or pulled out from the rack.

The slide rail structure 100 includes a first slide rail 110, a slider 120, a first connecting part 130, and a second connecting part 140. The first slide rail 110 is suitable for fixing on the rack. The slider 120 is disposed on the first slide rail 110, and the slider 120 is suitable for sliding on the first slide rail 110. The first connecting part 130 is suitable for fixing on the chassis 200. The second connecting part 140 is fixed to the slider 120 and slidably connected to the first connecting part 130. Although the following embodiment takes the single slide rail structure 100 as an example, in the practical application, the slide rail structure 100 may be disposed as a pair on the two sides of the chassis 200 and the rack. Moreover, the distance maintained between the two slide rail structures 100 is substantially equal to the width of the rack.

The aforementioned first slide rail 110 is fixed on the rack. The first slide rail 110 may include a slide rail body 112 and two stoppers 114 and 116. The two stoppers 114 and 116 are assembled respectively on two ends of the slide rail body 112. Moreover, the first slide rail 110 may fix the two ends of the slide rail body 112 to the rack respectively by screwing. The slider 120 is suitable for sliding on the first slide rail 110. For example, the slider 120 may include a sliding part 122 and a clamping part 124. The clamping part 124 is connected to the sliding part 122. The sliding part 122 is assembled to the first slide rail 110 and disposed within the first slide rail 110. The clamping part 124 is disposed outside of the first slide rail 110 and includes an assembly groove 124a. In the present embodiment, the second connecting part 140 is a strip-shaped plate metal, which is fixed to the assembly groove 124a by screwing or other suitable methods, for instance. In light of the foregoing, as the slider 120 is assembled to the first slide rail 110 and the second connecting part 140 is fixed to the assembly groove 124a of the clamping part 124, the second connecting part 140 is connected to the first slide rail 110 through the slider 120. Additionally, the movement of the slider 120 enables the second connecting part 140 to move.

Furthermore, the second connecting part 140 is connected between the slider 120 and the first connecting part 130. The first connecting part 130 is fixed to an inner wall of the chassis 200, and the first connecting part 130 is a second slide rail. Thus, the chassis 200 may move relative to the rack by the first connecting part 130. It should be noted that by disposing the first connecting part 130 on the inner wall of the chassis 200 and the first slide rail 110 outside of the chassis 200, the space required to dispose the slide rails outside of the chassis 200 is reduced. Thus, the space reduced by the slide rail structure 100 allows the disposition of the wider chassis 200 in the rack with the same width.

Figure 3:
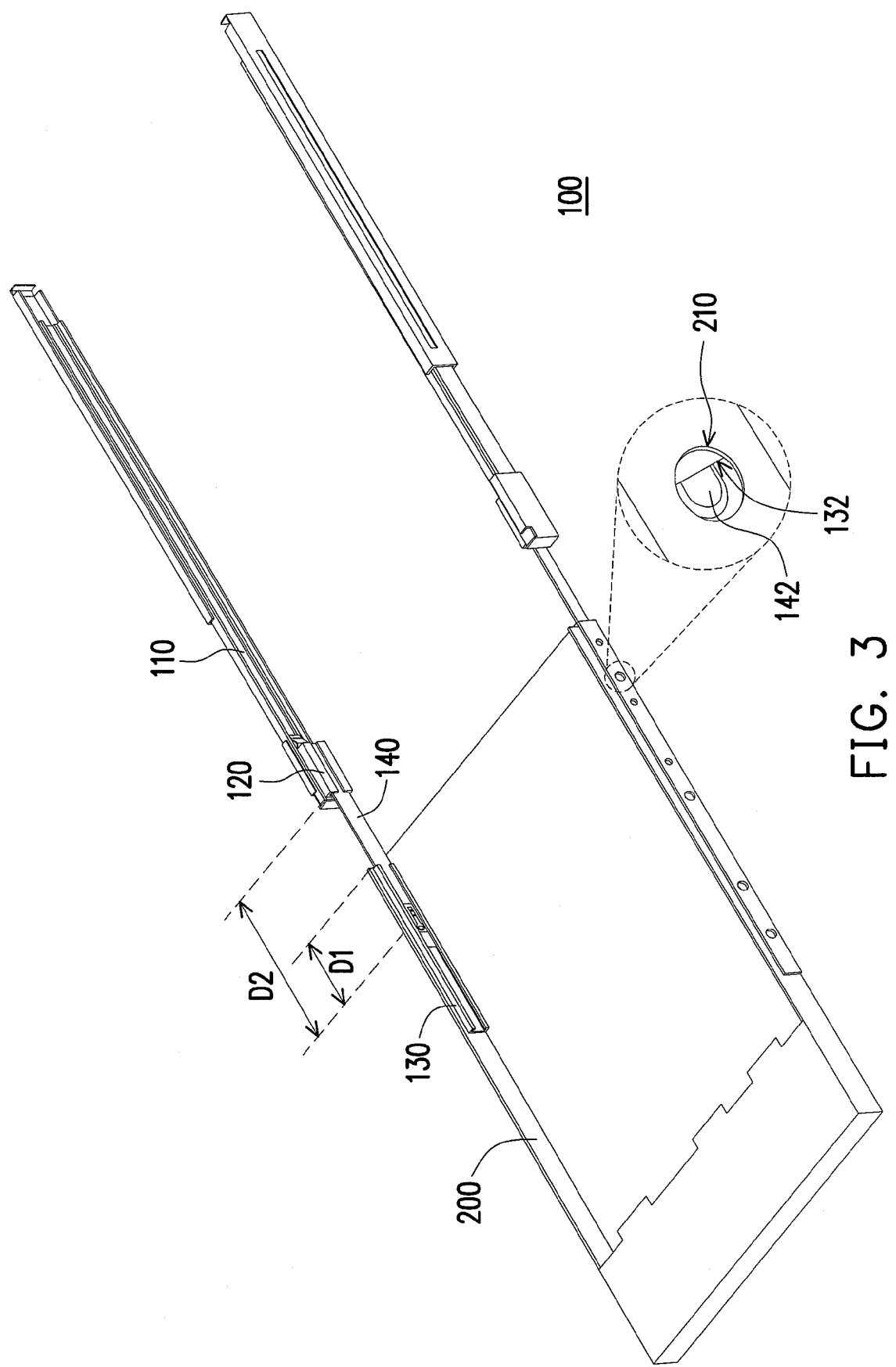
FIG. 3 is a perspective view of the elastic latch and the latch hole in FIG. 1 being latched together.

FIG. 3 is a perspective view of an elastic latch 142 and a latch hole 132 shown in FIG. 1 being latched together. Referring to FIG. 1 and FIG. 3, the second connecting part 140 further includes the elastic latch 142 disposed on one end of the second connecting part 140. The elastic latch 142 may be, for example, a metal leaf spring. The second connecting part 140 is suitable for sliding into the first connecting part 130, and the first connecting part 130 has the latch hole 132 corresponding to the elastic latch 142. The elastic latch 142 includes a fixing part 142a, an elastic arm 142b, a pressing part 142c, and a guiding part 142d. The fixing part 142a is disposed on the second connecting part 140. The elastic arm 142b is connected between the fixing part 142a and the pressing part 142c, and the pressing part 142c is connected between the elastic arm 142b and the guiding part 142d. In the present embodiment, the chassis 200 further includes a releasing hole 210, and the elastic latch 142 is exposed by the releasing hole 210. The distance from the center of the latch hole 132 to the end of the chassis 200 is a first distance D1. The distance from the center of the elastic latch 142 to the slider 120 is a second distance D2. Moreover, the second distance D2 is greater than the first distance D1. In the process of pushing the chassis 200 inside the rack, the pressing part 142c of the elastic latch 142 first slides into the latch hole 132 and latches with the latch hole 132 of the first connecting part 130. Since the second distance D2 is greater than the first distance D1, the chassis 200 may further slide into the rack that allows the pressing part 142c of the elastic latch 142 to depart from the latch hole 132 through the guiding of the guiding part 142d. Then, in the process of pulling the chassis 200 out from the rack, as the elastic arm 142b of the elastic latch 142 has elasticity, the pressing part 142s can slide into the latch hole 132 successfully (as shown in FIG. 3). Moreover, the pressing part 142c and the latch hole 132 remain latched in the pulling process to maintain relative positions of the first connecting part 130 and the second connecting part 140.

Particularly, the first slide rail 110 further includes a lead spring 118, which may be a zigzag metal leaf spring, for example. The leaf spring 118 is disposed on the slide rail body 112 to temporarily limit the slider 120 on one end of the slide rail body 112. More specifically, before the chassis 200 is assembled to the rack, the leaf spring 118 can stop the slider 120 to move on the slide rail body 112. When the chassis 200 is assembled to the rack, in the process of the chassis 200 pushing the slider 120 to move towards the rack, the slider 120 presses and deforms the leaf spring 118. When the pressing force has been released, the leaf spring 118 recovers its original shape. The design of disposing the leaf spring 118 on the slide rail body 112 not only temporarily limits the movement of the slider 120, but also maintains the relative positions of the first connecting part 130 and the second connecting part 140. Furthermore, the friction force resulting from the sliding of the chassis 200 on the slide rail body 112 increases, so as to reduce the sliding speed in the sliding process and prevent the chassis 200 from shaking and being unsteady.

Figure 4:
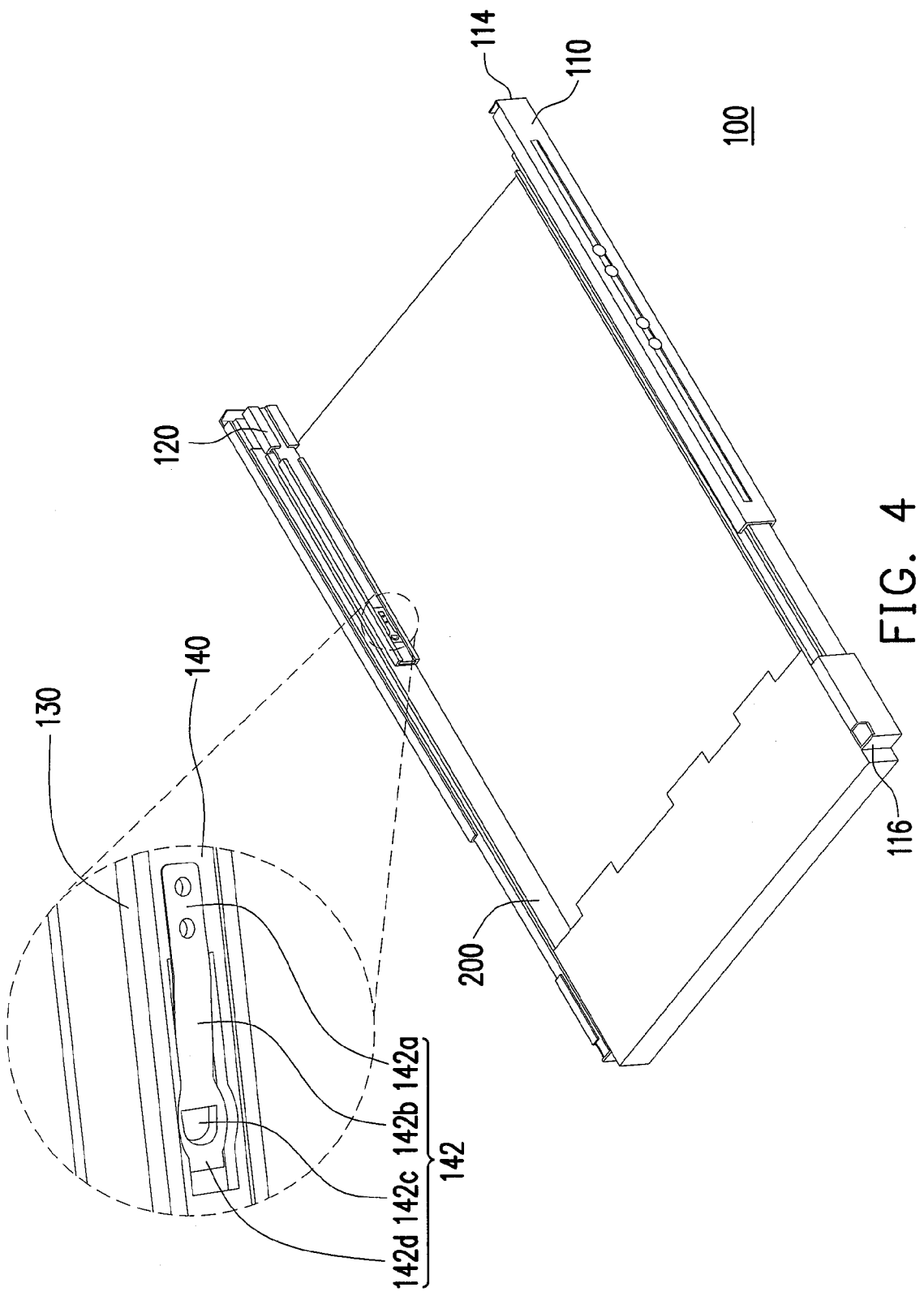
FIG. 4 is a schematic view of the slide rail structure in FIG. 1.

The assembly process of the chassis 200 and the rack is illustrated in the following. FIG. 4 is a schematic view of the slide rail structure in FIG. 1. Referring to FIG. 1 and FIG. 4, as the chassis 200 is pushed into the rack, the second connecting part 140 slides into the first connecting part 130. When the second connecting part 140 slides continually into the first connecting part 130 to a certain degree, the elastic latch 142 of the second connecting part 140 first slides into the latch hole 132 of the first connecting part 130. Since the second distance D2 from the center of the elastic latch 142 to the slider 120 is greater than the first distance DI from the center of the latch hole 132 to the end of the chassis 200, the chassis 200 can slide further into the rack. In addition, the elastic latch 142 and the latch hole 132 are then separated, and the chassis 200 slides continually until the chassis 200 comes into contact with the slider 120. At this time, the chassis 200 pushes the slider 120 and enables the second connecting part 140 to move along the slide rail body 112, such that the slider 120 slides until it contacts with the stopper 114. From the above description, the elastic latch 142 separates from the latch hole 132 before the chassis 200 comes into contact with the slider 120. Next, in the process of pulling the chassis 200 out of the rack, the elastic latch 142 slides into the latch hole 132 to maintain the relative positions of the first connecting part 130 and the second connecting part 140. As a consequence, the second connecting part 140 may move along the chassis 200, and the first connecting part 130 and the second connecting part 140 remain latched in the sliding process.

Furthermore, the slider 120 is promoted by the first connecting part 130 and the second connecting part 140, so the slider 120 slides until it contacts with the stopper 116. At this moment, as the elastic latch 142 of the first connecting part 130 is still latched to the latch hole 132 of the second connecting part 140, the chassis 200 is not completely separated from the rack.

In light of the foregoing, when the chassis 200 is to be separated completed from the rack, the user may press the pressing part 142c of the elastic latch 142 through the releasing hole 210 to separate the elastic latch 142 from the latch hole 132. Then, the second connecting part 140 can separate from the first connecting part 130 and allow the chassis 200 to be taken out of the rack. The design of the latching between the elastic latch 142 and the latch hole 132 not only increases the structural strength, but also allows the user to separate the chassis 200 from the rack.

Moreover, through the disposition of the two stoppers 114 and 116, the sliding path of the slider 120 on the slide rail body 112 is limited. Consequently, when the chassis 200 moves relative to the rack, a structural interference is generated between the two stoppers 114 and 116 of the first slide rail 110 and the slider 120 to prevent the chassis 200 from sliding out of the rack accidentally.

In summary, in the slide rail structure of the present invention, as the first connecting part is disposed on the inner wall of the chassis and the first slide rail is disposed outside of the chassis, the chassis can slide smoothly on the rack. In addition, the space required to dispose the rails outside of the chassis is reduced, so the slide rail structure of the present invention may be disposed in an area with smaller width. Besides, in some embodiments, the latching between the second connecting part and the first connecting part may be released conveniently by pressing the elastic latch to separate the chassis and the rack, which provides more convenience. Also, the present invention provides maintenance and internal component replacement of the computer host directly on the rack. In other words, the computer host remains installed on the slide rail when performing maintenance or replacing internal components.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A slide rail structure disposed between a chassis and a rack, comprising:
   a first slide rail, fixed on the rack;
   a slider, slidably connected to the first slide rail, wherein the slider comprising:
      a sliding part, assembled to the first slide rail and disposed within the first slide rail; and
      a clamping part, connected to the sliding part, wherein the clamping part is disposed outside of the first slide rail and the clamping part has an assembly groove to accommodate the second connecting part;
   a first connecting part, fixed on the chassis; and
   a second connecting part, fixed on the slider and slidably connected to the first connecting part, wherein the chassis slides on the first slide rail through the slider, the first connecting part and the second connecting part.

2. The slide rail structure of claim 1, wherein the first slide rail comprises:
   a slide rail body; and
   two stoppers, assembled to two ends of the slide rail body respectively to limit a sliding path of the slider on the slide rail body.

3. The slide rail structure of claim 2, wherein the first slide rail further comprises a leaf spring disposed on the slide rail body to limit the slider on one end of the slide rail body temporarily.

4. The slide rail structure of claim 1, wherein the first connecting part is a second slide rail and the second connecting part is suitable for sliding into the second slide rail.

5. The slide rail structure of claim 4, wherein the second connecting part comprises an elastic latch and the second slide rail has a latch hole corresponding to the elastic latch.

6. The slide rail structure of claim 5, wherein a distance from a center of the latch hole to an end of the chassis is a first distance, a distance from a center of the elastic latch to the slider is a second distance, and the second distance is greater than the first distance.

7. The slide rail structure of claim 6, wherein the elastic latch first slides into the latch hole and then departs from the latch hole when the chassis is pushed into the rack, and the elastic latch slides into the latch hole again to maintain relative positions of the first connecting part and the second connecting part when the chassis is pulled out from the rack.

8. The slide rail structure of claim 6, wherein the elastic latch comprises:
   a fixing part, disposed on the second connecting part;
   an elastic arm;
   a pressing part; and
   a guiding part, wherein the elastic arm is connected between the fixing part and the pressing part and the pressing part is connected between the elastic arm and the guiding part.

9. The slide rail structure of claim 4, wherein the second connecting part is a strip-shaped plate metal.

10. The slide rail structure of claim 4, wherein the chassis has a releasing hole and the elastic latch is exposed by the releasing hole.

11. The slide rail structure of claim 1, wherein the first connecting part is fixed on an inner wall of the chassis and the first slide rail is disposed outside of the chassis.

* * * * *